United States Patent
Park et al.

(10) Patent No.: US 11,201,250 B2
(45) Date of Patent: Dec. 14, 2021

(54) SCHOTTKY BARRIER DIODE AND METHOD FOR MANUFACTURING THE SAME

(71) Applicant: ELECTRONICS AND TELECOMMUNICATIONS RESEARCH INSTITUTE, Daejeon (KR)

(72) Inventors: Dong Woo Park, Sejong-si (KR); Kyung Hyun Park, Daejeon (KR); Jeong Woo Park, Daejeon (KR); Jun Hwan Shin, Daejeon (KR); Eui Su Lee, Sejong-si (KR); Hyun Soo Kim, Daegu (KR); Kiwon Moon, Daejeon (KR); Il Min Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 16/848,826

(22) Filed: Apr. 14, 2020

(65) Prior Publication Data
US 2020/0335639 A1 Oct. 22, 2020

(30) Foreign Application Priority Data

Apr. 16, 2019 (KR) .................. 10-2019-0044206

(51) Int. Cl.
*H01L 29/872* (2006.01)
*H01L 29/205* (2006.01)
(Continued)

(52) U.S. Cl.
CPC ...... *H01L 29/872* (2013.01); *H01L 21/28581* (2013.01); *H01L 21/30612* (2013.01);
(Continued)

(58) Field of Classification Search
CPC ............. H01L 29/872; H01L 29/66212; H01L 29/205; H01L 29/475; H01L 29/66219;
(Continued)

(56) References Cited

U.S. PATENT DOCUMENTS 5,070,035 A * 12/1991 Hattori ................. H01L 29/517
438/590
5,930,636 A 7/1999 Oki et al.
(Continued)

FOREIGN PATENT DOCUMENTS

JP 3077670 B2 8/2000
KR 100277419 B1 2/2001
(Continued)

OTHER PUBLICATIONS

Xiao-Yu Liu et al., "A High-Sensitivity Terahertz Detector Based on a Low-Barrier Schottky Diode", Chin. Phys. Lett. vol. 34, No. 7 (2017) pp. 070701-070701-4.

*Primary Examiner* — Jose R Diaz
(74) *Attorney, Agent, or Firm* — Rabin & Berdo, P.C.

(57) ABSTRACT

A Schottky barrier diode includes a substrate, a first semiconductor layer formed on the substrate, a second semiconductor layer formed on the first semiconductor layer, and a metal layer formed on the second semiconductor layer to form a Schottky barrier, wherein the first semiconductor layer and the second semiconductor layer are formed of different materials, and a conduction band offset between the first semiconductor layer and the second semiconductor layer is less than a set value.

9 Claims, 9 Drawing Sheets

(51) Int. Cl.
*H01L 29/47* (2006.01)
*H01L 29/66* (2006.01)
*H01L 21/285* (2006.01)
*H01L 21/306* (2006.01)

(52) U.S. Cl.
CPC .......... *H01L 29/205* (2013.01); *H01L 29/475* (2013.01); *H01L 29/66212* (2013.01); *H01L 29/66219* (2013.01)

(58) Field of Classification Search
CPC ......... H01L 21/28581; H01L 21/30612; H01L 31/00
See application file for complete search history.

(56) References Cited

U.S. PATENT DOCUMENTS

| | | | |
|---|---|---|---|
| 5,942,790 A | 8/1999 | Park et al. | |
| 6,037,646 A | 3/2000 | Oki et al. | |
| 6,949,774 B2 | 9/2005 | Parikh et al. | |
| 7,476,956 B2 | 1/2009 | Parikh et al. | |
| 7,989,842 B2 | 8/2011 | Kazemi et al. | |
| 7,994,512 B2 | 8/2011 | Parikh et al. | |
| 8,710,546 B2 | 4/2014 | Park et al. | |
| 8,999,744 B2 | 4/2015 | Park et al. | |
| 9,171,967 B2 | 10/2015 | Takizawa et al. | |
| 9,412,882 B2 | 8/2016 | Takizawa et al. | |
| 9,595,586 B2 | 3/2017 | Takizawa et al. | |
| 9,685,509 B2 | 6/2017 | Kittl et al. | |
| 9,917,158 B2 | 3/2018 | Kittl et al. | |
| 10,147,793 B2 | 12/2018 | Obradovic et al. | |
| 2003/0015708 A1 | 1/2003 | Parikh et al. | |
| 2006/0086997 A1 | 4/2006 | Kanaya et al. | |
| 2010/0207166 A1* | 8/2010 | Zhu .................. | H01L 29/872 257/201 |
| 2016/0284872 A1 | 9/2016 | Park et al. | |
| 2017/0162655 A1 | 6/2017 | Takizawa et al. | |

FOREIGN PATENT DOCUMENTS

| | | |
|---|---|---|
| KR | 1020040030849 A | 4/2004 |
| KR | 1020060053233 A | 5/2006 |
| KR | 1020120047042 A | 5/2012 |
| KR | 1020140095080 A | 7/2014 |
| KR | 1020160063280 A | 6/2016 |

* cited by examiner

RELATED ART

RELATED ART

Type 1
(Straddling Gap)

Type 2
(Staggered Gap)

Type 3
(Broken Gap)

SCHOTTKY BARRIER DIODE AND METHOD FOR MANUFACTURING THE SAME

CROSS-REFERENCE TO RELATED APPLICATION

This application claims priority to and the benefit of Korean Patent Application No. 10-2019-0044206 filed in the Korean Intellectual Property Office on Apr. 16, 2019, the entire contents of which are incorporated herein by reference.

BACKGROUND OF THE INVENTION

(a) Field of the Invention

The present invention relates to a Schottky barrier diode and a method for manufacturing the same. In particular, the present invention relates to a Schottky barrier diode and a method for manufacturing the same that can respond more effectively to terahertz (THz) electromagnetic waves.

(b) Description of the Related Art

Detectors used in the THz band are classified into thermal detectors and photon detectors. The heat detector is a device for measuring temperature change due to light absorption. The heat detector allows accurate energy measurement, but has a disadvantage in that the response time is slow. A photon detector is a device for measuring the current generated when light absorbed by a semiconductor forms electron-hole pairs. Since the photon energy of the THz band is very small, a material having a very small band gap must be used to manufacture a photon detector, but in reality, no material is available for the photon detector. The Schottky barrier diode is a typical THz detector capable of operating at room temperature. The Schottky barrier diode is a diode using a Schottky barrier that occurs through the junction of a metal and a semiconductor. The metal and the semiconductor have different Fermi levels. When the metal and the semiconductor contact, the Fermi level of the metal coincides with the Fermi level of the semiconductor. The Fermi level pinning on the semiconductor surface is occurred by the difference between the work function of the metal and the electron affinity of the semiconductor, and the junction of the metal and the semiconductor is determined to be a Schottky contact or an ohmic contact depending on a direction. The Schottky barrier diode is a rectifier capable of high speed operation due to a low threshold voltage, a short reverse recovery time, low junction capacitance, and the like, and has a switching speed that can effectively respond to THz electromagnetic waves. For the Schottky barrier diode, since the electrical charge mobility of the semiconductor material to be used should be fast, gallium arsenide (GaAs), indium gallium arsenide (InGaAs), and the like corresponding to representative III-V compound semiconductors are used. The detection band of a Schottky barrier diode is extending to THz and infrared radiation (IR) regions beyond the RF (radio frequency) region using characteristics of ultrahigh-speed operating devices.

A Schottky barrier diode for detecting THz electromagnetic waves uses an $n^-$ type of semiconductor because charge mobility is an important factor. In the ohmic layer corresponding to the $n^+$ type of semiconductor, a material having a high doping concentration is used to reduce resistance. However, thin film growth of a high doping concentration is limited depending on the growth equipment, and has a problem that the quality of the thin film is not good. In addition, the Schottky barrier diode has a disadvantage that the uniformity of the thin film is low due to characteristics of the device.

SUMMARY OF THE INVENTION

The present invention has been made in an effort to provide a Schottky barrier diode and method for manufacturing the same having advantages of responding more effectively to THz electromagnetic waves through a simple structure change.

According to an exemplary embodiment of the present invention, a Schottky barrier diode is provided. The Schottky barrier diode includes a substrate, a first semiconductor layer formed on the substrate, a second semiconductor layer formed on the first semiconductor layer, and a metal layer formed on the second semiconductor layer to form a Schottky barrier, wherein the first semiconductor layer and the second semiconductor layer are formed of different materials, and a conduction band offset between the first semiconductor layer and the second semiconductor layer is less than a set value.

The first semiconductor layer may be an $n^+$ type, and the second semiconductor layer may be an $n^-$ type.

The first semiconductor layer may include indium phosphide and the second semiconductor layer may include indium gallium arsenide.

The set value may be thermal energy at room temperature (300K).

The Schottky barrier diode may further include an insulating layer formed between the metal layer and the second semiconductor layer.

The Schottky barrier diode may further include an ohmic metal layer formed on the first semiconductor layer after etching to the second semiconductor layer and the insulating layer at portion thereof.

The second semiconductor layer and the first semiconductor layer may be partially etched under the Schottky metal layer.

The Schottky barrier diode may further include a buffer layer formed between the substrate and the first semiconductor layer, and the buffer layer may be formed from the same material as the first semiconductor layer.

According to another embodiment of the present invention, a manufacturing method of a Schottky barrier diode is provided.

The manufacturing method includes doping a first material on a substrate to form a first semiconductor layer, doping a second material different from the first material on the first semiconductor layer to form a second semiconductor layer, and forming a Schottky metal layer on the second semiconductor layer such that a Schottky barrier is formed, wherein a conduction band offset between the first semiconductor layer and the second semiconductor layer is less than a conduction band offset between a first semiconductor layer and a second semiconductor layer of the same materials.

The first semiconductor layer may be an $n^+$ type, and the second semiconductor layer may be an $n^-$ type.

The first semiconductor layer may include indium phosphide and the second semiconductor layer may include indium gallium arsenide.

The manufacturing method may include forming an insulating layer between the second semiconductor layer and the Schottky metal layer.

The manufacturing method may include forming an ohmic metal layer on the first semiconductor layer after etching to the second semiconductor layer and the insulating layer at a portion before forming the Schottky metal layer.

The manufacturing method may include partially etching the second semiconductor layer and the first semiconductor layer under the Schottky metal layer after forming the Schottky metal layer.

DETAILED DESCRIPTION OF THE EMBODIMENTS

Figure 1:
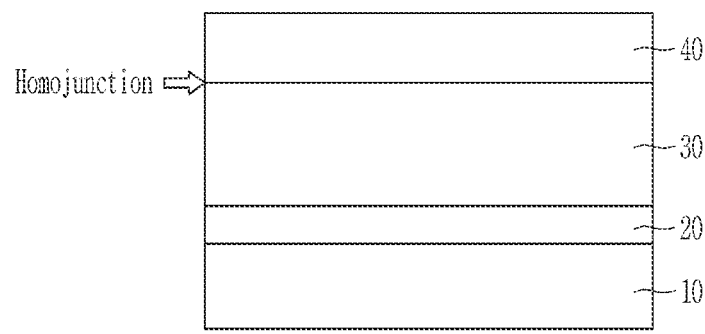
FIG. 1 is a diagram illustrating the structure of a general Schottky barrier diode.

Hereinafter, embodiments of the present invention will be described in detail with reference to the attached drawings so that a person of ordinary skill in the art may easily implement the present invention. The present invention may be modified in various ways, and is not limited thereto. In the drawings, elements that are irrelevant to the description of the present invention are omitted for clarity of explanation, and like reference numerals designate like elements throughout the specification.

Throughout the specification and claims, when a part is referred to "include" a certain element, it means that it may further include other elements rather than exclude other elements, unless specifically indicated otherwise.

Hereinafter, a Schottky barrier diode and a method for manufacturing the same according to embodiments of the present invention will be described in detail with reference to the accompanying drawings.

FIG. 1 is a diagram illustrating the structure of a general Schottky barrier diode.

Referring to FIG. 1, the Schottky barrier diode includes a substrate 10, a buffer layer 20, an ohmic layer 30 corresponding to an n$^+$ semiconductor layer, and a Schottky layer 40 corresponding to an n$^-$ semiconductor layer. A detector used in the THz band uses an n-type semiconductor because electric charge mobility is an important factor. Thus, an n-type semiconductor is shown in FIG. 1.

The ohmic layer 30 is formed on the substrate 10. Generally, a semi-insulating (SI) substrate may be used as the substrate 10 in order to reduce the capacitance of the Schottky barrier diode for THz detection.

The buffer layer 20 may be formed between the ohmic layer 30 and the substrate 10. The buffer layer 20 may be formed using undoped indium phosphide (InP).

The Schottky layer 40 is formed on the ohmic layer 30.

In the case of the ohmic layer 30, a higher doping concentration is better to reduce resistance, but when the doping concentration is 1E19 cm$^{-3}$ or higher, strain increases in the crystal structure due to characteristics of semiconductor materials. Therefore, the doping concentration in the semiconductor should be used appropriately for the purpose, and a structurally stable maximum doping concentration is required in the Schottky barrier diode.

Increasing the doping concentration to the point where the Schottky barrier disappears is advantageous for THz detection characteristics in the Schottky layer 40.

In a general Schottky barrier diode, the ohmic layer 30 and the Schottky layer 40 have homogeneous junction structures of the same material doped at different concentrations.

A metal (not shown in FIG. 1) is formed on the Schottky layer 40.

The Schottky barriers are determined by the type of metal and semiconductor. When titanium with high bonding strength which is generally used is deposited on the Schottky layer 40, the doping concentration of the Schottky layer 40 is increased to 1E18 cm$^{-3}$ in case of GaAs, and is increased to 2E17 cm$^{-3}$ in case of GaAs.

Figure 2:
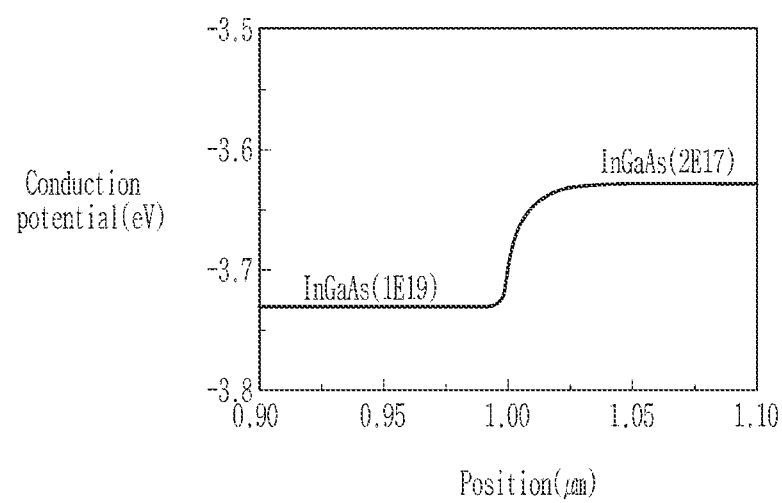
FIG. 2 is a diagram illustrating an example of conduction band offset between two semiconductors of the same type doped at different concentrations.

FIG. 2 is a diagram illustrating an example of conduction band offset between two semiconductors of the same type doped at different concentrations.

As referred in FIG. 2, the ohmic layer 30 and the Schottky layer 40 may have a homogeneous junction structure of the same material doped at different concentrations. For example, the ohmic layer 30 and the Schottky layer 40 may be formed using InGaAs doped at different concentrations.

As described above, since the ohmic layer 30 and the Schottky layer 40 are formed with the same kind of semiconductor material, the conduction band offset is increased as the doping concentration difference is increased. In this case, since the energy of the THz electromagnetic wave is very small, the movement of electrons is limited.

Figure 3:
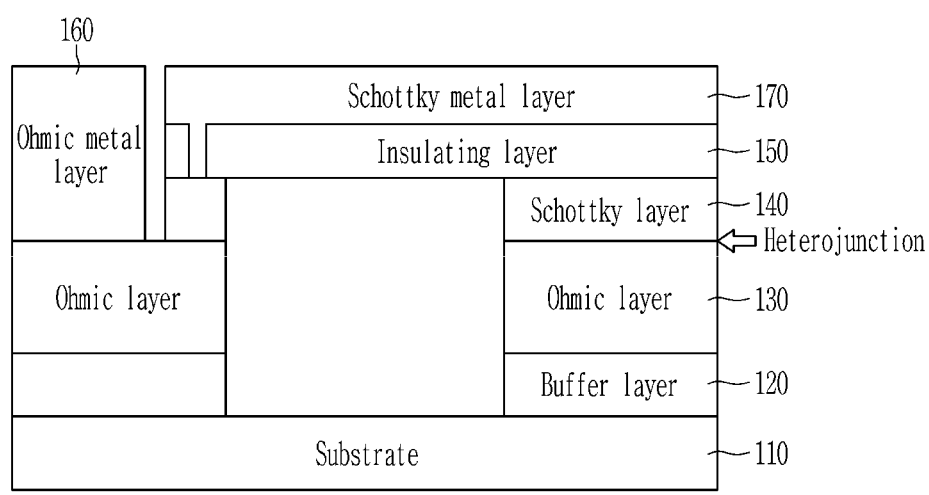
FIG. 3 is a diagram illustrating the structure of a Schottky barrier diode according to an embodiment of the present invention.

FIG. 3 is a diagram illustrating the structure of a Schottky barrier diode according to an embodiment of the present invention.

Referring to FIG. 3, a buffer layer 120 is formed on a substrate 110, an ohmic layer 130 is formed on the buffer layer 120, and a Schottky layer 140 is formed on the ohmic layer 130.

The ohmic layer 130 and the Schottky layer 140 are formed with semiconductors of different materials. That is, the Schottky barrier diode has a heterojunction structure that bonds semiconductors of different materials where the difference of lattice matching or lattice constant is not large.

In case of a Schottky barrier diode that rectifies small energy such as THz, the conduction band offset between the ohmic layer 130 and the Schottky layer 140 performs a role of a barrier for preventing the movement of electrons.

Therefore, according to the Schottky barrier diode of the embodiment of the present invention, by matching the conduction band energy level with different materials of the ohmic layer 130 and the Schottky layer 140, electrons may easily move.

In FIG. 1, the Schottky barrier diode for the THz detector uses an SI substrate as the substrate 10.

Meanwhile, according to an embodiment of the present invention, an SI-indium phosphorus (InP) substrate doped with iron (Fe) may be used as the substrate 110, and the buffer layer 120 may be formed by growing with, for example, undoped InP. The ohmic layer 130 is formed by growing InP:Si in which InP and silicon (Si) are combined at a set ratio, and the Schottky layer 140 is formed by growing InGaAs:Si.

In order to reduce the capacitance, an insulator layer 150 may be formed of a silicon dioxide film (SiO2) on the Schottky layer 140. After etching to the Schottky layer 140 and the insulating layer 150 corresponding to the deposition position of the ohmic metal, an ohmic metal layer 160 is deposited on the ohmic layer 130 at the corresponding position, and then heat treatment is performed.

Since the materials of the Schottky layer 140 and the ohmic layer 130 are different, when etching is performed using a phosphoric acid solution mixed with an appropriate ratio of H3PO4, H2O2, H2O, and the like, which selectively etches InGaAs of the Schottky layer 140, the ohmic layer 130 may not be damaged.

The Schottky metal layer 170 is deposited on the insulator layer 150. A Schottky metal layer 170 may be deposited to an appropriate size using the characteristic that the THz detection characteristic becomes better as the junction area between the metal and the semiconductor becomes smaller due to the capacitance. Subsequently, in order to reduce the parasitic capacitance, the lower part of the Schottky metal layer 170 is etched. When etching the lower part of the Schottky metal layer 170, the Schottky layer 140 is etched, and then the ohmic layer 130 and the buffer layer 120 are etched. In this case, since the ohmic layer 130, the buffer layer 120, and the substrate 110 all include InP, when $H_3PO_4$:HCl corresponding to a selective etching solution of InP is used for etching, the Schottky layer 140, which is the most important part, may not be damaged.

Figure 4:
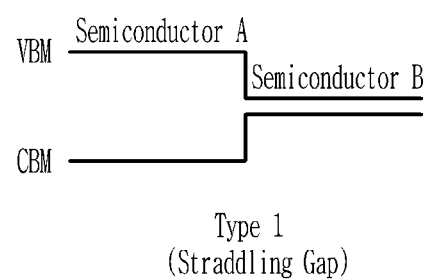
FIGS. 4 to 6 show examples of band alignment formed when two semiconductors having different band gaps meet, respectively.
Figure 5:
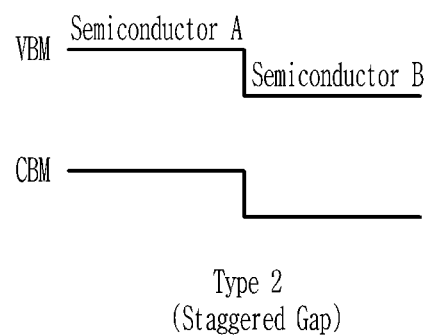
Figure 6:
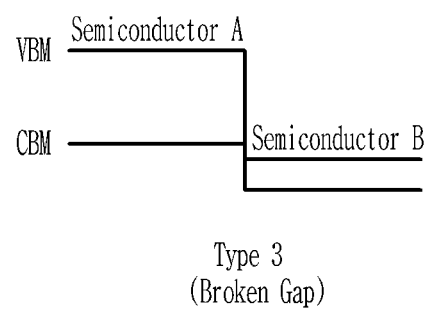

FIGS. 4 to 6 show examples of band alignment formed when two semiconductors having different band gaps meet, respectively.

Referring to FIGS. 4 to 6, since the heterojunction structure has different band gaps and electron affinities of the semiconductors, the alignments generated in the heterojunctions can be classified into Type 1, Type 2, and Type 3 according to conditions.

For example, as referred to in FIG. 4, Type 1 represents an alignment state in which positions of the conduction band minimum (CBM) and valence band maximum (VBM) of a semiconductor B having a small band gap are completely located within VBM and CBM of a semiconductor A with a large band gap. These two semiconductors A and B may include GaAs/AlGaAs, $In_{0.53}Ga_{0.47}As/In_{0.52}Al_{0.48}As$, GaN/InGaN, $In_{0.53}Ga_{0.47}As$/InP, and the like. As referred to in FIG. 5, Type 2 represents an alignment state in which the gap between CBM and CBM of a semiconductor A having a large band gap overlaps with the gap between VBM and CBM of a semiconductor B having a small band gap. These two semiconductors may include Si/Ge, GaAs/GaSb, InP/$In_{0.52}Al_{0.48}As$, and the like. Finally, as referred to in FIG. 6, Type 3 represents an alignment state in which the band gap between VBM and CBM of a semiconductor B having a small band gap is lower than the band gap between CBM and CBM of a semiconductor A having a large band gap and do not overlap each other. These two semiconductors may include GaSb.

In this case, in order to obtain higher ohmic characteristics, the doping amount may be increased on a side of the ohmic junction to facilitate tunneling. Accordingly, the low doping layer may be configured as the Schottky layer 140, and the high doping layer may be configured as the ohmic layer 130.

Figure 7:
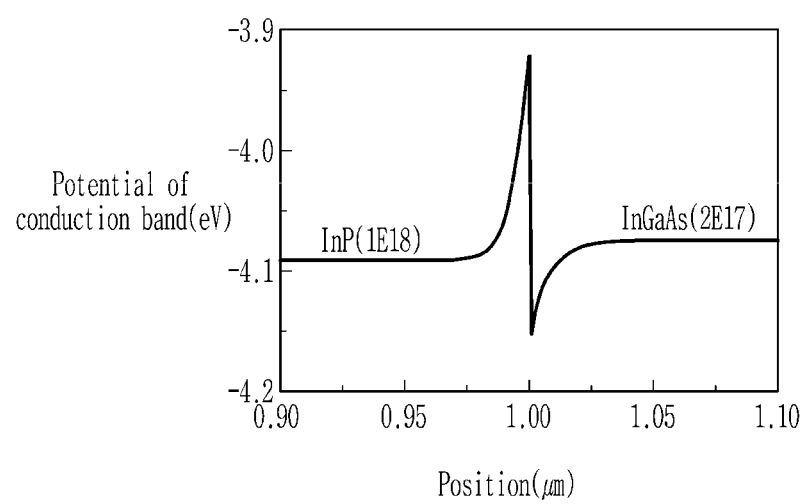
FIG. 7 is a diagram illustrating an example of conduction band alignment occurring in a heterojunction structure of InP and InGaAs.

FIG. 7 is a diagram illustrating an example of conduction band alignment occurring in a heterojunction structure of InP and InGaAs, and shows simulation results using the Harold program in the heterojunction structure of InP and InGaAs that is designed to be smaller than 26 meV corresponding to the thermal energy at room temperature (300K).

Referring to FIG. 7, the ohmic layer is formed with InP and the Schottky layer is formed with InGaAs. In this case, the conduction band offset between the ohmic layer and the Schottky layer is 16 meV. This value is less than 26 meV corresponding to the thermal energy at room temperature (300K). The band gap spike at the surface between InP and InGaAs is theoretical and is smoothed due to inter-diffusion of molecules by growth temperature and defects occurring during growth.

Figure 8:
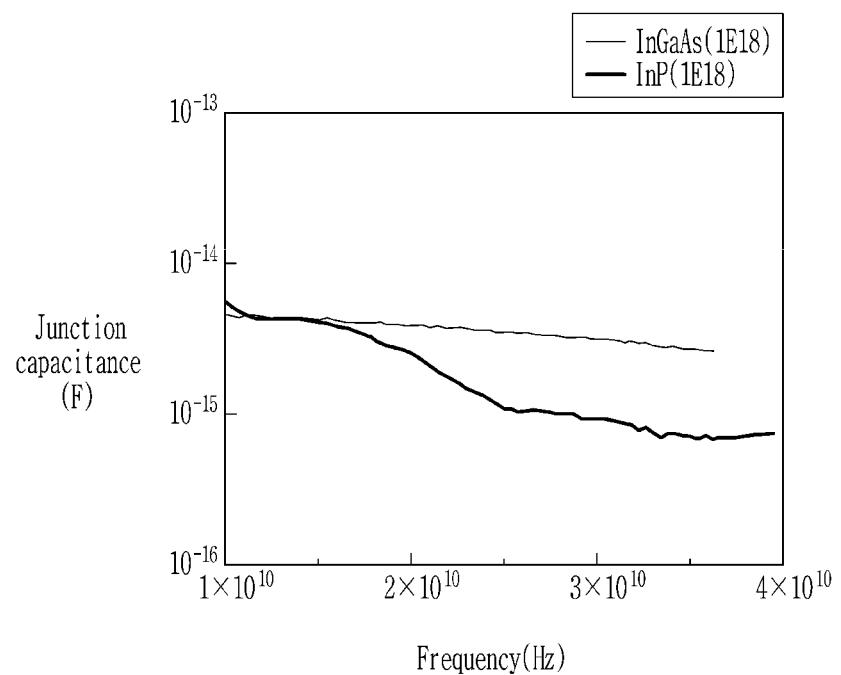
FIG. 8 is a graph illustrating junction capacitance of InP and InGaAs.

FIG. 8 is a graph illustrating the junction capacitance of InP and InGaAs.

Referring to FIG. 8, in the case of InP and InGaAs, InGaAs generally has high capacitance because the dielectric constant of the InGaAs is relatively high, and thus high frequency characteristics are not good. However, when InP having a relatively small dielectric constant is used, the capacitance may be reduced, thus the THz detection characteristics are improved.

Figure 9:
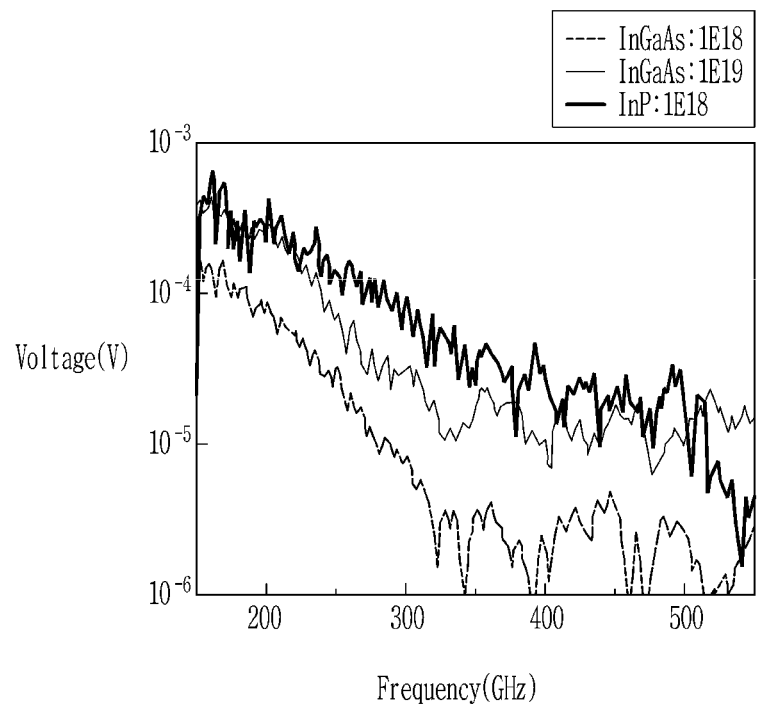
FIG. 9 is a diagram illustrating an example of a THz detection signal of a Schottky barrier diode according to a material change of an ohmic layer shown in FIG. 3.

FIG. 9 is a diagram illustrating an example of a THz detection signal of a Schottky barrier diode according to a material change of an ohmic layer shown in FIG. 3.

In order to show the results of FIG. 9, growth was performed on the SI—InP:Fe substrate 110 by using metal organic chemical vapor deposition (MOCVD). The buffer layer 120 was formed to a thickness of 300 nm using undoped InP and the Schottky layer 140 was formed to a thickness of 200 nm using InGaA:Si ($2E17$ $cm^{-3}$) of an n⁻ type, and the process was minimized to reduce the variable.

Referring to FIG. 9, when the ohmic layer 130 is formed using InP having the doping concentration of $1E18$ $cm^{-3}$, it can be confirmed that it has a higher THz response than using InGaAs of the same material as the Schottky layer 140 having a doping concentration of $1E18$ $cm^{-3}$. Furthermore, it can be confirmed that it has a higher THz response than using InGaAs with a doping concentration of $1E19$ $cm^{-3}$ which has 10 times the number of electrons. This result is possible because a large amount of reacting electrons flow to the electrode by minimizing elements that disturb movement of electrons in response to very small THz electromagnetic waves.

That is, if only the material of the Schottky layer 140 is determined, the ohmic layer 130 may minimize the conduction band offset between the ohmic layer 130 and the Schottky layer 140 by changing materials, compositions, doping, etc.

According to an embodiment of the present invention, by minimizing the conduction band (or valence band) offset between the ohmic layer and the Schottky layer of the semiconductor, the response to THz electromagnetic waves can be easily increased by supplying the electrons well.

In addition, since selective etching enables Schottky barrier diodes with heterojunction structures, errors in the process may be minimized.

The present specification includes details of a number of specific implements, but it should be understood that the details do not limit any invention or what is claimable in the specification but rather describe features of the specific example embodiment. Features described in the specification in the context of individual example embodiments may be implemented as a combination in a single example embodiment. In contrast, various features described in the specification in the context of a single example embodiment may be implemented in multiple example embodiments individually or in an appropriate sub-combination. Furthermore, the features may operate in a specific combination and may be initially described as claimed in the combination, but one or more features may be excluded from the claimed combination in some cases, and the claimed combination may be changed into a sub-combination or a modification of a sub-combination.

Similarly, even though operations are described in a specific order on the drawings, it should not be understood as the operations needing to be performed in the specific order or in sequence to obtain desired results or as all the operations needing to be performed. In a specific case, multitasking and parallel processing may be advantageous. In addition, it should not be understood as requiring a separation of various apparatus components in the above described example embodiments in all example embodiments, and it should be understood that the above-described program components and apparatuses may be incorporated into a single software product or may be packaged in multiple software products.

It should be understood that the example embodiments disclosed herein are merely illustrative and are not intended to limit the scope of the invention. It will be apparent to one of ordinary skill in the art that various modifications of the example embodiments may be made without departing from the spirit and scope of the claims and their equivalents.

What is claimed is:

1. A Schottky barrier diode comprising:
   a substrate;
   a first semiconductor layer formed on the substrate;
   a buffer layer formed between the substrate and the first semiconductor layer;
   a second semiconductor layer formed on the first semiconductor layer; and
   a Schottky metal layer formed on the second semiconductor layer to form a Schottky barrier,
   wherein the buffer layer is formed from a same material as the first semiconductor layer, and
   wherein the first semiconductor layer and the second semiconductor layer are formed of different materials, and a conduction band offset between the first semiconductor layer and the second semiconductor layer is less than a set value.

2. The Schottky barrier diode of claim 1, wherein the first semiconductor layer is an $n^+$ type, and the second semiconductor layer is an $n^-$ type.

3. The Schottky barrier diode of claim 1, wherein the set value is thermal energy at room temperature (300K).

4. The Schottky barrier diode of claim 1, further comprising
   an insulating layer formed between the metal layer and the second semiconductor layer.

5. The Schottky barrier diode of claim 4, further comprising
   an ohmic metal layer formed on the first semiconductor layer after etching to the second semiconductor layer and the insulating layer at a portion thereof.

6. The Schottky barrier diode of claim 1, wherein the second semiconductor layer and the first semiconductor layer are partially etched under the Schottky metal layer.

7. A manufacturing method of a Schottky barrier diode, the manufacturing method comprising:
   doping a first material on a substrate to form a first semiconductor layer;
   doping a second material different from the first material on the first semiconductor layer to form a second semiconductor layer;
   forming a Schottky metal layer on the second semiconductor layer such that a Schottky barrier is formed;
   forming an insulating layer between the second semiconductor layer and the Schottky metal layer; and
   partially etching the second semiconductor layer and the first semiconductor layer under the Schottky metal layer after forming the Schottky metal layer,
   wherein a conduction band offset between the first semiconductor layer and the second semiconductor layer is less than a conduction band offset between a first semiconductor layer and a second semiconductor layer of same materials.

8. The manufacturing method of claim 7, wherein the first semiconductor layer is an $n^+$ type, and the second semiconductor layer is an $n^-$ type.

9. The manufacturing method of claim 7, further comprising
   forming an ohmic metal layer on the first semiconductor layer after etching to the second semiconductor layer and the insulating layer at a portion before forming the Schottky metal layer.

* * * * *